(12) United States Patent
Suzuki

(10) Patent No.: US 6,501,532 B2
(45) Date of Patent: *Dec. 31, 2002

(54) EXPOSURE APPARATUS AND METHOD OF CONTROLLING THE SAME

(75) Inventor: Daisuke Suzuki, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/213,261

(22) Filed: Dec. 17, 1998

(65) Prior Publication Data

US 2002/0018191 A1 Feb. 14, 2002

(30) Foreign Application Priority Data

Dec. 19, 1997 (JP) ............................................. 9-364371

(51) Int. Cl.$^7$ ..................... G03B 27/42; G03B 27/52; G03B 27/54; A61N 5/00; G21K 5/10
(52) U.S. Cl. .......................... 355/53; 355/55; 355/67; 355/77; 250/492.2; 250/492.22
(58) Field of Search ............................ 355/53, 55, 67, 355/77; 250/492.2, 492.22

(56) References Cited

U.S. PATENT DOCUMENTS 5,661,548 A * 8/1997 Imai .......................... 355/55
5,739,899 A * 4/1998 Nishi et al. .................... 355/53
5,789,734 A * 8/1998 Torigoe et al. ............. 250/548
5,917,581 A * 6/1999 Suzuki ........................ 355/55

FOREIGN PATENT DOCUMENTS

JP  60-020513  2/1985
JP  8-227854  9/1996

* cited by examiner

Primary Examiner—Russell Adams
Assistant Examiner—Khaled Brown
(74) Attorney, Agent, or Firm—Fitzpatrick, Cella, Harper & Scinto

(57) ABSTRACT

In a step and repeat process with a projection exposure apparatus, a pre-auto focus process is performed so as to compensate for a focus error caused by traveling of an XY stage wherein the pre-auto focus process is performed in a period in which the XY stage is moved from one exposure location to another. The pre-auto focus process minimizes the focus error, which is further corrected in a focus adjustment process using an auto focus sensor. This technique allows a focus adjustment to be made with improved accuracy in a short time. The focus error corrected in the pre-auto focus process is such an error of the position, in a direction along the optical axis, of the exposure surface with respect to the projection image plane that occurs when the XY stage is driven in a plane that is not parallel to the projection image plane and that is proportional to the traveling distance of the XY stage in the XY plane.

21 Claims, 6 Drawing Sheets

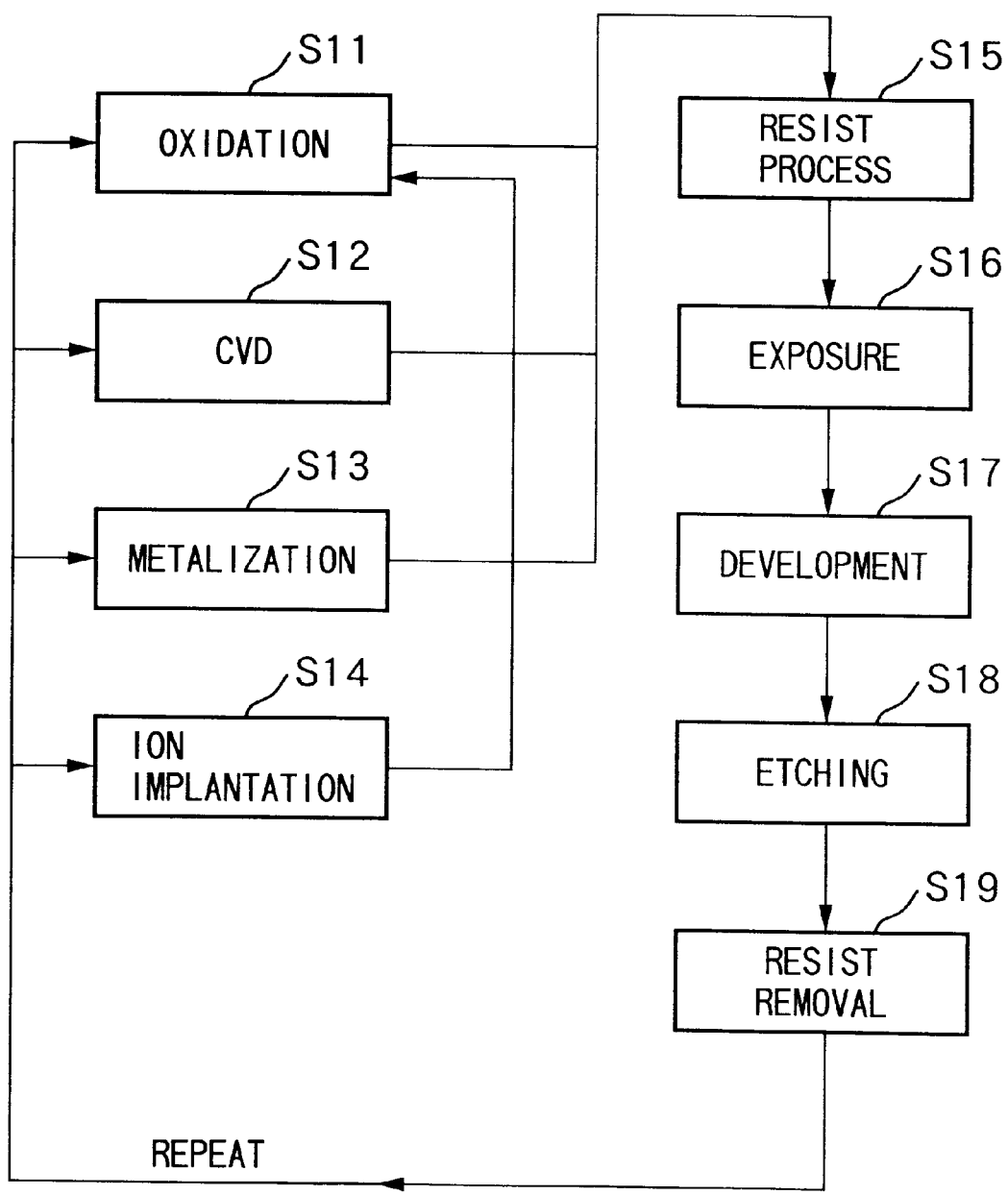

EXPOSURE APPARATUS AND METHOD OF CONTROLLING THE SAME

BACKGROUND OF THE INVENTION

1. Field of the Invention

The present invention relates to an exposure apparatus suitable for use as a step-and-repeat reduction projection exposure apparatus for producing a device, and also to a method of controlling such an exposure apparatus. More specifically, the present invention relates to an exposure apparatus provided with an auto-focusing apparatus for making a focus adjustment by positioning the surface of each exposure area on a semiconductor wafer placed on a wafer stage with respect to the projection image plane of a reduction projection is lens system (projection optical system) so that a precisely focused image is formed on each exposure area, and also to a method of controlling such an exposure apparatus.

2. Description of the Related Art

In a known step-and-repeat projection exposure apparatus, the focus adjustment is generally accomplished by detecting a positional deviation of the exposure surface from the projection image plane and correcting the detected deviation each time an XY stage is moved to a location where an area to be exposed (exposure shot) is just below a projection lens.

When a small-sized pattern is transferred through a reduction projection optical system including a lens with a large diameter and thus a large numerical aperture, the depth of focus decreases with the increase in the diameter of the lens. The result of the reduction in the depth of focus is that the image transfer performance becomes sensitive to a focus error due to the non-uniformity of the surface to be exposed and/or due to the coating conditions of a photoresist. To avoid such a problem, a focus adjustment must be made for each exposure area. The focus adjustment mechanism generally includes an XY stage that is moved in a step and repeat fashion so that an area to be exposed comes to a location just below a projection lens; an auto-focus sensor for detecting a focus error between the image plane and the surface of the exposure area located just below the projection lens; a Z stage for correcting the focus error detected by the sensor; and an auto-focus control system for controlling the above-described elements.

The sequence of exposing each exposure area is performed as follows.

1. A wafer is moved (one step) by driving the XY stage so that an area to be exposed (exposure area) comes to a location just below the lens.

2. The focus error or the difference between the image plane of the projection optical system and the exposure area of the wafer is detected using the focus sensor.

3. The detected focus error is corrected by moving the Z stage in a direction along the optical axis.

4. Exposure is performed.

Each of a plurality of exposure areas is exposed in the process including steps 1 to 4 described above. That is, the above-described sequence including steps 1 to 4 is repeated as many times as there are exposure areas on the wafer placed on the stage.

In recent years, semiconductor devices have been produced using a wafer with an increasingly large size. Thus, the exposure apparatus is required to expose an increasingly greater number of exposure areas (shots) for each wafer. It is desired, thus, to improve the throughput of the step-and-repeat exposure apparatus. Furthermore, as the line width of a pattern to be transferred has become smaller, higher precision control is required in the focus adjustment in a shorter time.

However, in the step-and-repeat reduction exposure apparatus, it is required to move the XY stage steps by step so that a plurality of exposure areas (shots) on a wafer come one after another to a location just below the projection lens for exposure. A focus error between the projection image plane and the exposure shot occurs each time the XY stage is moved because of the difference between the traveling plane of the XY stage and the projection image plane.

The focus error between the projection image plane S and the exposure shot, including a focus error due to the non-uniformity of the surface of exposure areas, is detected by the auto-focus sensor and corrected by the Z stage. However, if the focus error is too large, the limitation in the adjustment capability of the Z stage results in a residual focus error greater than the upper limit allowed in the pattern-transfer process. One known technique to avoid the above problem is to repeatedly perform the detection and correction of the focus error using a feedback control technique until the focus error finally falls within the allowable range. However, the focus adjustment using the feedback control technique requires a long time, depending on the amount of the focus error. If the focus adjustment is performed using the auto-focus sensor and the Z stage without using the feedback control to improve the throughput, there can be a risk that the focus accuracy becomes lower than the required limit. For the reasons described above, the amount of correction in the focus-adjustment process should be as small as possible.

The focus error caused by the difference between the stage traveling plane and the projection image plane is proportional to the moving distance of the XY stage. To place a wafer with an increasing large size, it is required that the XY stage have an increasingly large size. As a result, the reduction in the focus error caused by the difference between the stage traveling plane and the projection image plane has become an important factor to achieve an exposure apparatus with sufficiently high performance.

SUMMARY OF THE INVENTION

In view of the above, it is an object of the present invention to provide a stage apparatus and an exposure apparatus capable of rapidly positioning the stage and making focus adjustment, and also a method of controlling such a stage and an exposure apparatus.

It is another object of the present invention to provide a technique to improve the throughput and the accuracy of the focus adjustment performed for each exposure shot using a step-and-repeat exposure apparatus.

It is still another object of the present invention to provide a technique to theoretically predict a focus error and correct the predicted focus error during the movement of the stage thereby achieving rapid positioning of the stage.

According to an aspect of the present invention, to achieve the above objects, there is provided a stage apparatus including: a stage movable in a first direction parallel to a first plane and also in a second direction substantially perpendicular to the first plane; first moving means for moving the stage by a specified distance in the first direction; calculation means for calculating a deviation in the second direction from a reference plane which will occur as a result of the movement of the stage accomplished by the first moving means, the calculation being performed based on the specified distance and the angle between the reference plane and the first plane; and second moving means for moving the stage in the second direction during the movement of the stage accomplished by the first moving means, so as to compensate for the deviation calculated by the calculation means.

The present invention also provides an exposure apparatus including the stage apparatus described above.

Furthermore, the invention provides a method of controlling the stage apparatus and the exposure apparatus.

Still furthermore, the invention provides a method of producing a device using the method of controlling the exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a flowchart illustrating the details of the wafer process shown in FIG. 5.

DETAILED DESCRIPTION OF THE PREFERRED EMBODIMENTS

Figure 1:
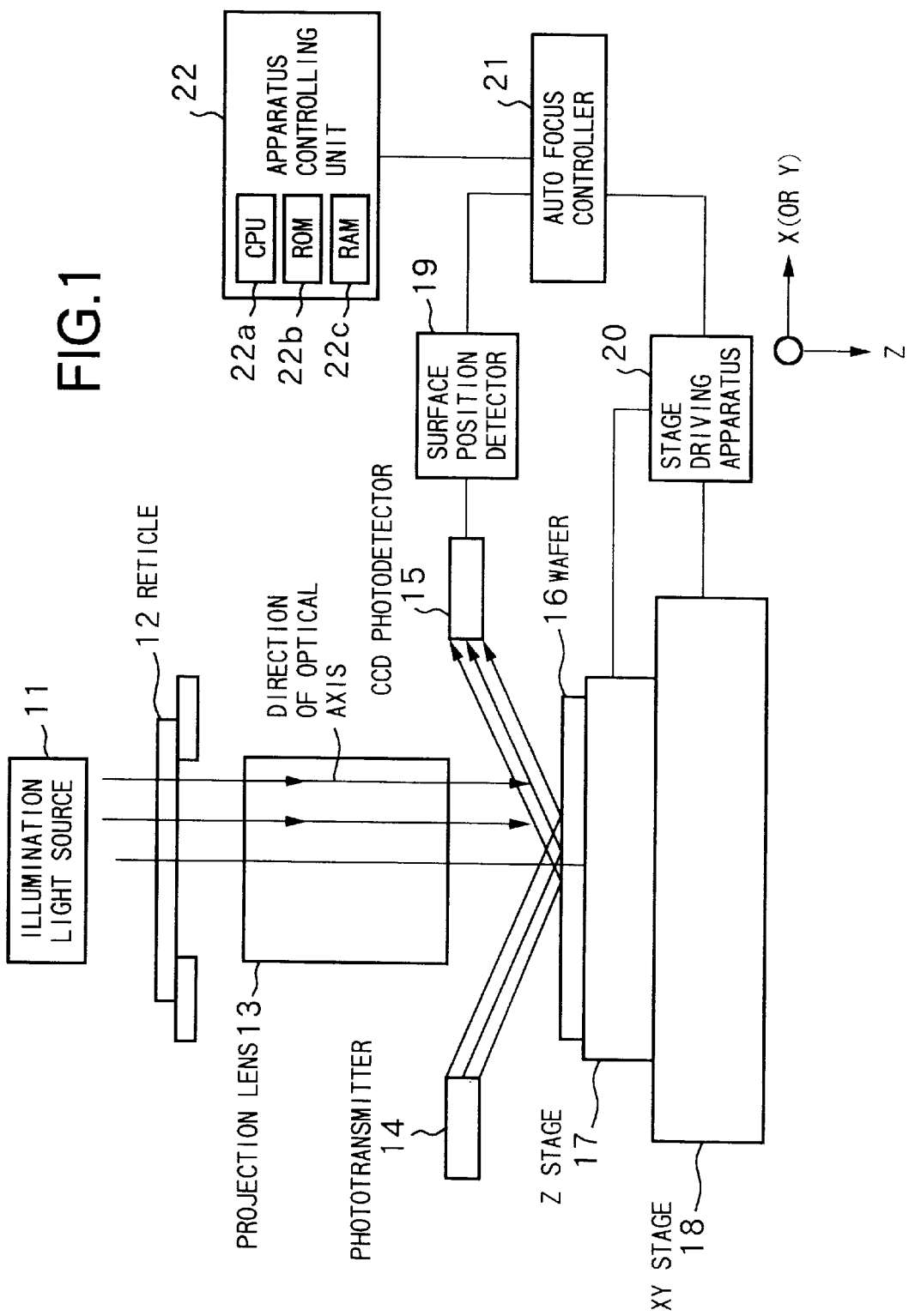
FIG. 1 is a schematic diagram illustrating an embodiment of a projection exposure apparatus according to the present invention.

Preferred embodiments of the present invention will now be described in detail in accordance with the accompanying drawings.

In a preferred embodiment of the present invention, a projection exposure apparatus includes a projection optical system (projection lens) for forming an image of a pattern with a reduced size; and an XY stage movable in a two-dimensional plane XY substantially perpendicular to the optical axis (Z axis) of the projection optical system. The image of the pattern with the reduced size is transferred onto a wafer placed on the XY stage, while moving the XY stage so that a plurality of exposure areas on the wafer are exposed one by one (in a step and repeat fashion). The projection exposure apparatus also includes an auto-focus system for making a focus adjustment so that the position, in the Z axis, of each exposure shot on the wafer becomes coincident with the image plane where the image is formed through the projection optical system. The auto-focus system includes a focus sensor, a Z stage for correcting the focus error detected by the focus sensor, and means for driving the Z stage. Using the auto-focus system, focus adjustment is performed each time the XY stage is moved from one exposure location to another exposure location (that is, focus adjustment is performed for each step and repeat operation). One factor causing a focus error that occurs when the XY stage is moved from one location to another is the tilt of the stage traveling plane with respect to the image plane where the image is formed through the projection optical system, wherein the stage traveling plane is defined herein as a plane formed by a point on the XY stage moving from one location to another. In the present embodiment of the invention, the focus error component described above is predicted by a calculation on the basis of the moving distance of the XY stage and the previously measured tilt of the stage traveling plane with respect to the image plane of the projection optical system. During the movement of the XY stage to the next exposure location, the Z stage is driven by an amount corresponding to the predicted focus error so as to compensate for the focus error.

If the XY stage is assumed to move in directions exactly perpendicular to each other, then the XY stage traveling plane is a flat plane. In this case, it is possible to calculate the focus error, that will occur as a result of the movement of the XY stage, from the tilt of the stage traveling plane with respect to the projection image plane of the lens and the moving distance of the stage from one exposure location to another. If the Z stage is driven by an amount corresponding to the calculated focus error during the movement of the stage to another exposure location after completion of focus adjustment and exposure on one exposure shot, it is possible to compensate for the focus error. A residual focus error still remaining after making the above-described compensation is that which occurs only due to the nonuniformity of the surface of the wafer. Thus, the focus error in the focus adjustment with the auto focus sensor is minimized. Furthermore, the time required for the focus adjustment is reduced and the focus adjustment accuracy is improved.

The present invention is described in further detail below with reference with specific embodiments.

First Embodiment

The invention is described below with reference to a first embodiment. FIG. 1 is a schematic diagram of a step-and-repeat projection exposure apparatus according to the first embodiment of the present invention. As shown in FIG. 1, a pattern formed on a reticle 12 to be transferred is illuminated by an illumination light source 11 and the image of the pattern is projected onto a wafer 16 through a projection lens 13 thereby forming a reduced image of the pattern on the wafer 16.

In this step-and-repeat projection exposure apparatus, there is provided a focus adjustment mechanism including an XY stage 18 for carrying the wafer in an XY plane so that the exposure shot comes to a location just below the projection lens 13, an auto focus sensor system including elements 14, 15, and 19 for detecting the focus error between the image plane and the exposure area just below the projection lens, a Z stage 17 which is driven in a direction along the optical axis so as to correct the focus error detected by the auto-focus sensor, and an apparatus controlling unit 22 responsible for control over the entire projection-exposure apparatus. The current position of the exposure shot surface in the direction along the optical axis is detected by the auto-focus sensor as follows. A spot light beam is projected from a phototransmitter 14 in a diagonal direction onto the wafer so as to illuminate the area to be detected. Light reflected from the wafer is detected by a CCD photodetector 15 and image processing is performed by a surface position detector 19. The auto-focus controller 21 compares the detected surface position with the predicted position of the projection image plane stored in a memory device (ROM 22b) of the apparatus controlling unit 22. If a difference is detected, it is concluded that there is a focus error and the Z stage 17 is driven by a stage driving apparatus 20 by an amount corresponding to the detected focus error. Depending on the driving accuracy of the Z stage 17, there is a possibility that the focus error cannot be corrected to a sufficient degree. The focus error may be reduced to a value within an allowable range by repeatedly performing the surface-position detection and the stage-position correction using a feedback control technique.

In the present embodiment, to reduce the time required for the focus adjustment process and improve the accuracy thereof, the theoretically predicted focus error is compensated for in the period in which the XY stage is moved from one exposure shot to another, This compensation process is called a pre-auto focus process.

Figure 2:
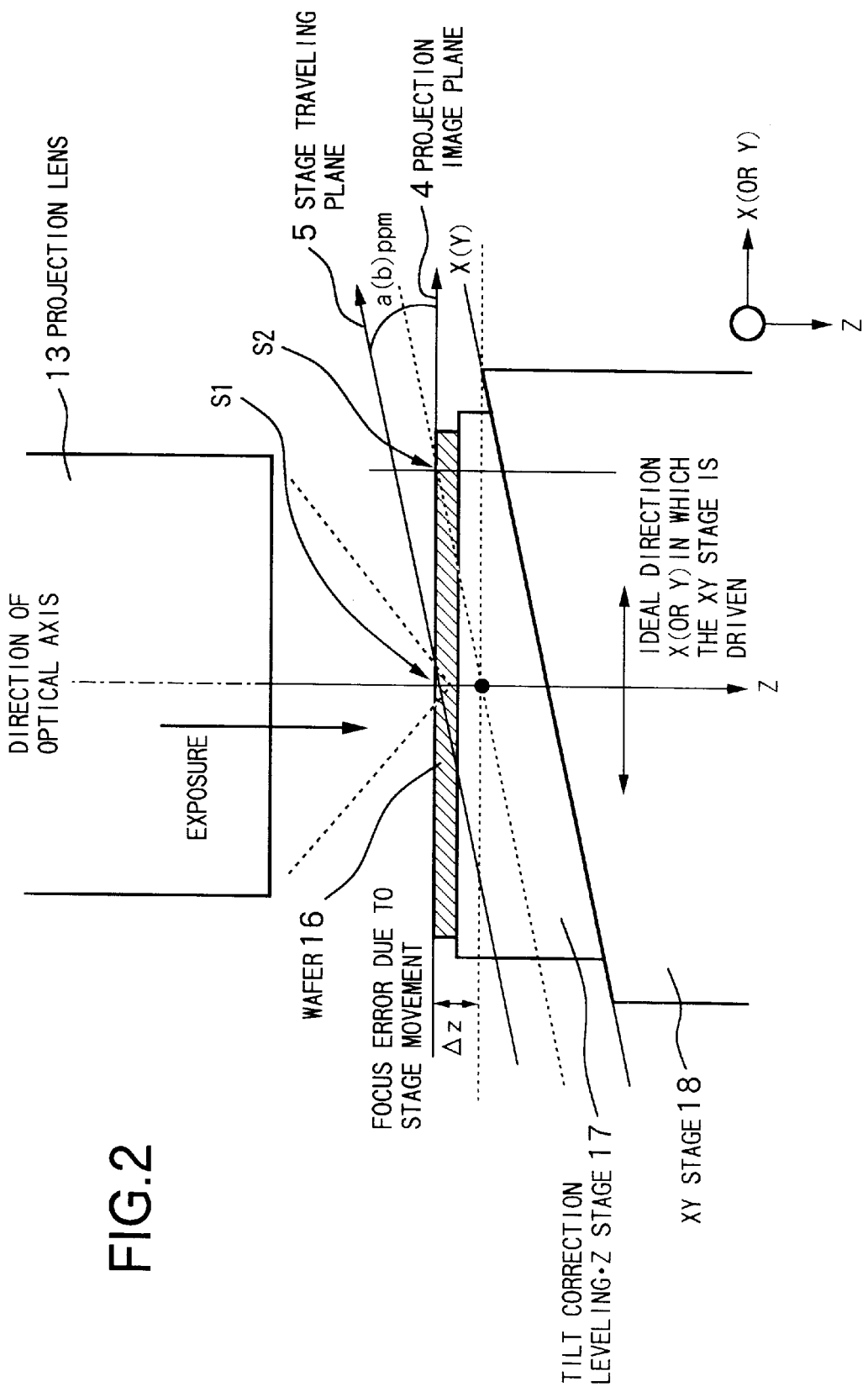
FIG. 2 is a schematic diagram conceptually illustrating a focus error due to a movement of an XY stage.

The focus error caused by the movement of the stage, which should be corrected in the pre-auto focus process, can be calculated as follows. FIG. 2 illustrates the relationship between the projection image plane of the projection optical system and the driving plane of the XY stage which moves along axes perpendicular to each other (this driving plane is herein referred to as a stage traveling plane). In FIG. 2, the position of the projection image plane 4 can be calculated, as will be described in further detail later, from the resolution of a test pattern transferred onto a wafer using the present projection exposure apparatus.

When the XY stage is driven, each point (S1, S2) on the wafer 16 placed on the XY stage 2 moves with respect to the projection image plane 4 in a direction parallel the stage traveling plane. Herein the wafer is assumed to have an uniform and flat surface, and the wafer is assumed to be positioned, by the tilt correction leveling Z stage 17 provided on the XY stage, with respect the projection image plane so that the surface of the wafer becomes parallel to the projection image plane.

After completion of the exposure on the exposure shot S1 on the wafer, if the wafer is moved by driving the XY stage until another exposure shot S2 comes to the exposure area just below the projection lens, then a focus error of $\Delta Z$ occurs when the exposure shot S2 arrives at the exposure location as a result of the movement of the surface S2 of the exposure area in a direction parallel to the stage traveling plane. Herein, this focus error $\Delta Z$ is referred to as a stage-traveling focus error. If the stage-traveling focus error is corrected each time the XY stage is driven, it is theoretically possible to eliminate the focus error except for a residual focus error due to the nonuniformity of the surface of the wafer. Thus, what is further required is to correct such a residual focus error in the focus adjustment process using the auto focus sensor.

The stage-traveling focus error $\Delta Z$ can be calculated as follows. If the stage traveling plane has a relative tilt angle, a (ppm) in the X direction and b (ppm) in the Y direction, with respect to the projection image plane, and the XY stage moves by a distance x (mm) in the X direction and y (mm) in the Y direction when it moves from one exposure shot to another exposure shot, then the focus error in the direction along the optical axis (Z direction), which will occur after the XY stage is driven to the next exposure shot, can be given by:

$$\Delta Z\ (nm) = a \cdot x + b \cdot y \qquad (1)$$

For example, if the XY stage with a relative tilt angle of 20 (ppm) is moved by 20 (mm), the focus error calculated according to equation (1) is 0.4 μm, which is not negligibly small, to achieve a sufficiently good result in the pattern-transfer process using the exposure apparatus.

The relative tilt angle of the stage traveling plane with respect to the projection image plane is calculated as follows. First, the reference plane used to detect the tilt angle with the auto focus sensor is defined so that it is coincident with the stage traveling plane. To this end, the heights of a plurality of points on the XY stage are measured using the focus sensor and the tilt is calculated from the measured heights. The calculated tilt is registered as the reference tilt, which is used by the focus sensor in the focus adjustment process. A sample wafer is placed on the stage and the wafer-surface position is adjusted taking into the account the calculated tilt (die by die tilt correction). After completion of the above-described correction, a test pattern for evaluating the resolution of a transferred image is transferred onto the surface of the sample wafer. The resolution of the developed image varies depending on the tilt angle of the stage traveling plane with respect to the projection image plane of the projection optical system. Thus, the tilt angle of the stage traveling plane can be determined from the resolution of the developed image. The determined tilt angle is employed as the relative tilt angle between the projection image plane and the stage traveling plane. The relative tilt angle is stored, as coefficients a and b in equation (1), in the RAM 22c of the apparatus controlling unit 22.

Figure 3:
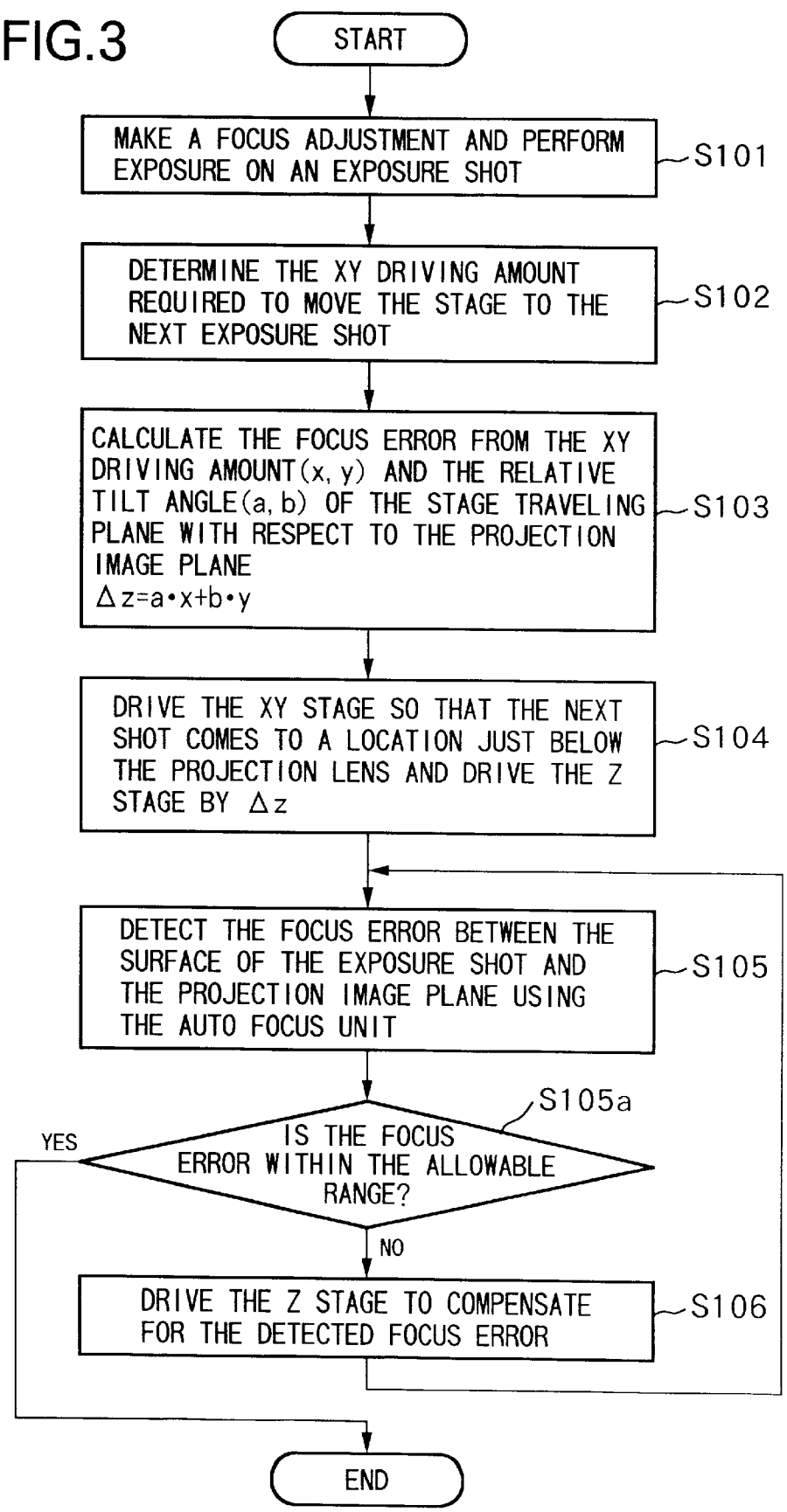
FIG. 3 is a flowchart illustrating a process of correcting a focus error in the apparatus shown in FIG. 1.

FIG. 3 illustrates a sequence of a step-and-repeat exposure process including the above-described pre-auto focus process using the apparatus shown in FIG. 1. This sequence is performed by the CPU 22a of the apparatus controlling unit in accordance with the program stored in the ROM 22b. In the first step (step 101), an exposure shot on a wafer is exposed through the projection optical system after precisely adjusting the focus. In accordance with the contents of the storage device of the apparatus controlling unit 22, incremental driving amounts x and y, which are required to move the XY stage from the current location to a location where the next exposure shot is just below the lens, are determined (step 102). $\Delta Z$, which will occur when the XY stage is driven so that the next exposure shot comes to the location just below the lens, is calculated from the relative tilt angle (a, b) between the projection image plane and the stage traveling plane wherein the relative tilt angle is stored in the storage device (RAM 22c) (step 103). The XY stage 16 is driven so that the exposure shot comes to the exposure location and compensation for $\Delta Z$ determined in step in 103 is made by driving the Z stage 17 (step 104). A focus error between the surface of the exposure shot and the projection image plane, which still remains after completion of the process in step 104, is detected using the auto-focus control system (step 105). If the focus error detected in step 105 is not within the allowable range, the residual focus error is corrected by driving the Z stage (steps 105a, 106). In the case where the correction process is performed by the apparatus controlling unit 22 in a feedback control mode, steps 105 to 106 are repeated until the focus error finally falls within the allowable range.

Second Embodiment

Figure 4:
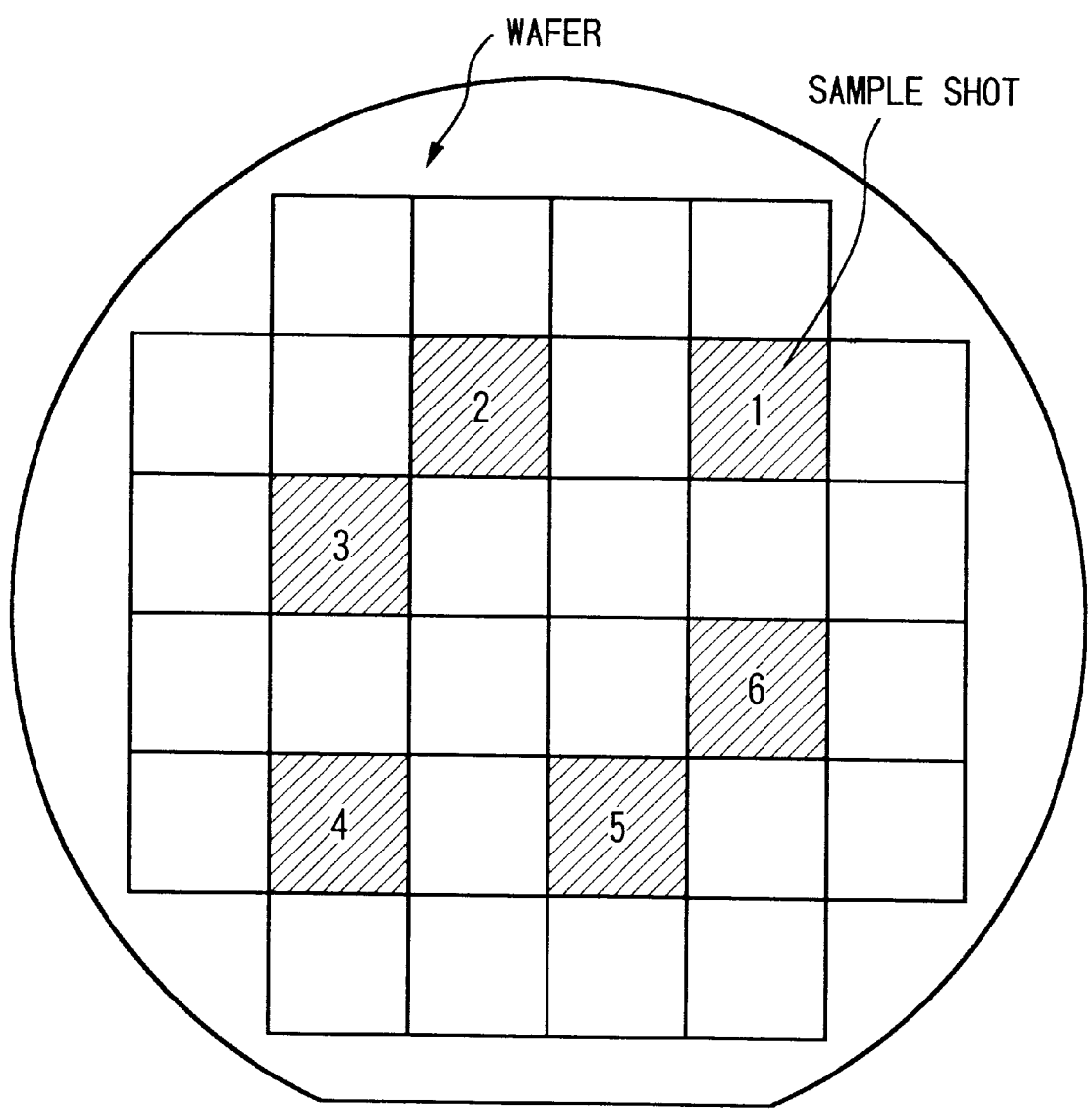
FIG. 4 is a schematic diagram illustrating a layout of sample shots used in a sample shot measurement.

In this second embodiment, a sample shot measurement process in the projection exposure apparatus is described. The sample shot measurement is a special process to measure exposure conditions. To this end, a plurality of exposure shots at properly selected locations on a wafer placed on the stage are exposed using the step-and-repeat reduction projection exposure apparatus, and exposure conditions are determined from the result. FIG. 4 illustrates an example of a layout of sample shots to be measured. The sample shot measurement is used for example to determine a global wafer tilt from the focus measurement on three or more points which are not in the same single line. The sample shot measurement is also used in the global alignment process for detecting an XY positional error for an exposure shot. In these applications, sample shots are selected so that they are at as distant locations as possible. Thus, in the sample shot measurement, it is required to minimize the measurement error due to the above-described focus error caused by the movement of the XY stage.

In the sample shot measurement, it is desirable that the sample shots be moved in a plane which is as well parallel as possible to the projection image plane. Therefore, also in the sequence of the sample-shot measurement, it is desirable that the look-ahead focus correction be used to cancel the deviation in the Z direction which occurs when the XY stage is moved from one sample point to another.

An example of a method of producing a device using the exposure apparatus or the exposure method is now described below.

Figure 5:
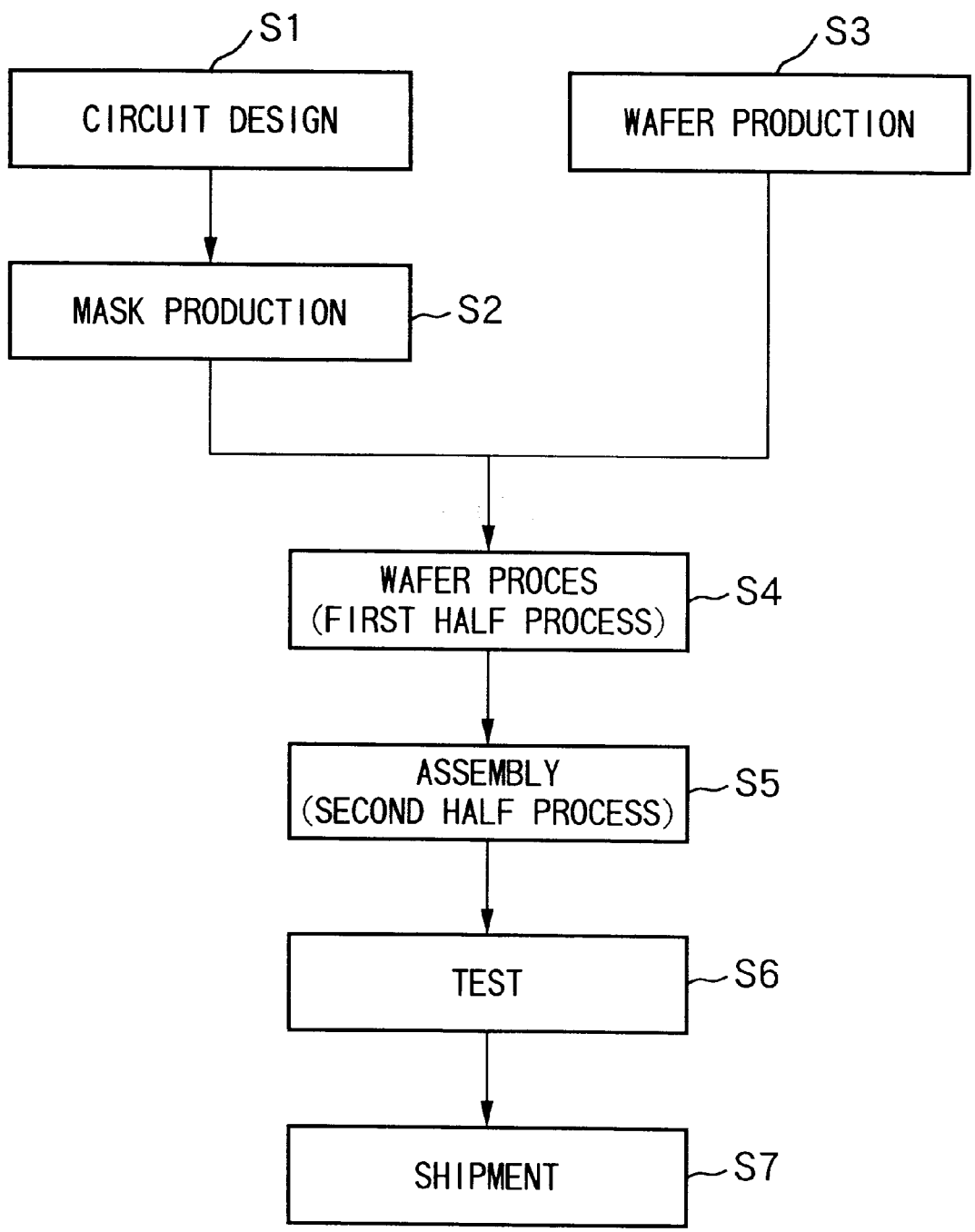
FIG. 5 is a flowchart illustrating a process of producing a micro device.

FIG. 5 is a flowchart illustrating the processing steps of producing a microstructure device (a semiconductor chip such as an IC or LSI, a liquid crystal display panel, a CCD, thin-film magnetic head, a micromachine). In step 1 (circuit design), device patterns are designed. In step 2 (mask production), masks having the patterns designed in step 1 are produced. In step 3 (wafer production), a wafer is produced using a material such as silicon or glass. In step 4 (wafer process or often called a first half process), an actual circuit is formed on the wafer by means of the lithography technique using the masks and the wafer produced in the previous steps. In step 5 (assembly or often called a second half process), the wafer produced in step 4 is divided into chips. This step includes sub steps of assembly (dicing and bonding) and packaging (chip encapsulation). In step 6 (test), the semiconductor devices produced in the previous steps are tested to check whether they operate correctly. The reliability of the devices are also evaluated in step 6. The semiconductor devices which have been completed through these steps are shipped in step 7.

FIG. 6 is a flowchart illustrating the details of the wafer process. In step 11 (oxidation), the surface of the wafer is oxidized. In step 12 (CVD), an insulating film is formed on the surface of the wafer. In step 13 (metalization), electrodes are formed on the surface of the wafer by means of evaporation. In step 14 (ion implantation), ions are implanted into the wafer. In step 15 (resist process), a photosensitive material is coated on the wafer. In step 16 (exposure), the circuit pattern formed on the mask is transferred onto the wafer using the above-described exposure apparatus having the look-ahead auto focus adjustment capability. In step 17 (development), the above wafer is developed. In step 18 (etching), the surface of the wafer is partially removed except the portions covered by the resist pattern developed in the previous step. In step 19 (resist removal), the resist, which has become no longer necessary after the etching process, is removed. The above process is performed repeatedly thereby forming a multilevel circuit pattern on the wafer.

Thus the present invention provides a method of producing a semiconductor device with a high integration density which cannot be achieved by the conventional techniques.

In the present invention, as described above, an expected focus error which will occur when the stage travels from one exposure location to another is calculated and the expected focus error is compensated for by means of the look-ahead correction or the pre-auto focus process in the period in which the stage is moved from one exposure location to another. After performing the pre-auto focus process, the residual focus error which may still remain when the next exposure shot comes to the location just below the projection lens, is such an error component caused only by the ununiformity of the surface of the wafer. Thus, the amount of focus correction required in the focus adjustment process is minimized. This brings about two improvements: a reduction in the process time, which is self-evident; and an improvement in the focus-correction accuracy by minimizing the focus error, which can be achieved even for the case where there is an upper limitation in the feedback control process time to obtain a sufficiently high throughput in production.

As many apparently widely different embodiments of the present invention can be made without departing from the spirit and scope thereof, it is to be understood that the invention is not limited to the specific embodiments thereof except as defined in the claims.

What is claimed is:

1. A stage apparatus comprising:

a stage movable in a first direction parallel to a stage traveling plane and also in a second direction substantially perpendicular to the stage traveling plane, the stage traveling plane being a plane formed by a point on said stage moving in a plurality of different first directions;

first direction moving means for moving said stage by a specified distance in the first direction;

calculation means for calculating a deviation in the second direction with respect to a reference plane, the reference plane being at an angle with respect to the stage traveling plane, the deviation occurring as a result of said first direction moving means moving said stage in the first direction, said calculation means calculating the deviation based on the specified distance and the angle; and second direction moving means for moving said stage in the second direction, during the movement of said stage in the first direction by said first direction moving means, so as to compensate for the deviation calculated by said calculation means.

2. A stage apparatus according to claim 1, wherein the movement in the first direction performed by said first direction moving means is accomplished by movement in an X direction parallel to the stage traveling plane and movement in a Y direction parallel to the stage traveling plane and perpendicular to the X direction.

3. A stage apparatus according to claim 2, further comprising storage means for storing a tilt angle in the X direction between the stage traveling plane and the reference plane and also storing a tilt angle in the Y direction between the stage traveling plane and the reference plane, wherein said calculation means calculates a sum of (i) a deviation determined from the tilt angle in the X direction and a movement distance in the X direction accomplished by the first direction moving means and (ii) a deviation determined from the tilt angle in the Y direction and a movement distance in the Y direction, and said calculation means determines a resultant sum as the deviation to be compensated for.

4. A stage apparatus according to claim 1, further comprising:

correction means for detecting a positional difference between a surface of said stage and the reference plane and correcting a position of said stage in accordance with the detected positional difference; and control means for performing the position correction using said correction means after said stage has been moved by said first direction and second direction moving means.

5. An exposure apparatus for exposing, through a projection optical system, an object to be exposed, said exposure apparatus comprising:
   a stage for placing the object to be exposed thereon, said stage being movable in a first direction parallel to a stage traveling plane and also in a second direction substantially perpendicular to the stage traveling plane, the stage traveling plane being a plane formed by a point on said stage moving in a plurality of different first directions;
   first direction moving means for moving said stage by a specified distance in the first direction;
   calculation means for calculating a deviation in the second direction with respect to an image plane associated with the projection optical system, the image plane being at an angle with respect to the stage traveling plane, the deviation occurring as a result of said first direction moving means moving said stage in the first direction, said calculation means calculating the deviation based on the specified distance and the angle; and
   second direction moving means for moving said stage in the second direction, during the movement of said stage in the first direction by said first direction moving means, so as to compensate for the deviation calculated by said calculation means.

6. An exposure apparatus according to claim 5, wherein the movement in the first direction performed by said first direction moving means is accomplished by movement in an X direction parallel to the stage traveling plane and movement in a Y direction parallel to the stage traveling plane and perpendicular to the X direction.

7. An exposure apparatus according to claim 6, further comprising storage means for storing a tilt angle in the X direction between the stage traveling plane and the image plane and also storing a tilt angle in the Y direction between the stage traveling plane and the image plane, wherein said calculation means calculates a sum of (i) a deviation determined from the tilt angle in the X direction and a movement distance in the X direction accomplished by the first direction moving means and (ii) a deviation determined from the tilt angle in the Y direction and a movement distance in the Y direction, and said calculation means determines a resultant sum as the deviation to be compensated for.

8. An exposure apparatus according to claim 5, further comprising auto focus means for detecting a positional difference between a surface of said stage and the image plane after the movement of said stage accomplished by said first direction and second direction moving means, and for performing an auto focusing process in accordance with the detected positional difference.

9. An exposure apparatus according to claim 8, further comprising feedback control means for providing feedback control, wherein the auto focusing process includes an auto focus adjustment based on the feedback control.

10. An exposure apparatus according to claim 5, wherein said first direction moving means moves the object to be exposed so that a particular area of the object to be exposed comes to an area where an image is formed through the projection optical system.

11. A method of controlling a stage movable in a first direction parallel to a stage traveling plane and in a second direction substantially perpendicular to the stage traveling plane, the stage traveling plane being a plane formed by a point on the stage moving in a plurality of different first directions, said method comprising:
   a first direction moving step of moving the stage in the first direction by a specified distance;
   a calculation step of calculating a deviation in the second direction with respect to a reference plane, the reference plane being at an angle with respect to the stage traveling plane, the deviation occurring as a result of the moving of the stage in said first direction moving step, said calculation step calculating the deviation based on the specified distance and the angle; and
   a second direction moving step of moving the stage in the second direction, during the movement of the stage in said first direction moving step, so as to compensate for the deviation calculated in said calculation step.

12. A method of controlling a stage according to claim 11, wherein the movement in the first direction performed in said first direction moving step is accomplished by movement in an X direction parallel to the stage traveling plane and movement in a Y direction parallel to the stage traveling plane and perpendicular to the X direction.

13. A method of controlling a stage according to claim 12, further comprising a storage step of storing a tilt angle in the X direction between the stage traveling plane and the reference plane and also storing a tilt angle in the Y direction between the stage traveling plane and the reference plane, wherein in said calculation step, a sum of (i) a deviation determined from the tilt angle in the X direction and a movement distance in the X direction accomplished by the first direction moving means and (ii) a deviation determined from the tilt angle in the Y direction and a movement distance in the Y direction is calculated and a resultant sum is determined as the deviation to be compensated for.

14. A method of controlling a stage according to claim 11, further comprising:
   a correction step of detecting a positional difference between a surface of the stage and the reference plane and correcting a position of the stage in accordance with the detected positional difference; and
   a control step of performing the position correction in said correction step after the stage has been moved by the first direction and second direction moving means.

15. A method of controlling an exposure apparatus including a stage movable in a first direction parallel to a stage traveling plane and also in a second direction substantially perpendicular to the stage traveling plane, the stage traveling plane being a plane formed by a point on the stage moving in a plurality of different first directions, the exposure apparatus being adapted to expose, via a projection optical system, an object which is to be exposed and which is placed on the stage, said method comprising:
   a first direction moving step of moving the stage in the first direction by a specified distance;
   a calculation step of calculating a deviation in the second direction with respect to an image plane associated with the projection optical system, the image plane being at an angle with respect to the stage traveling plane, the deviation occurring as a result of the moving of the stage in said first direction moving step, said calculation step calculating the deviation based on the specified distance and the angle; and
   a second direction moving step of moving the stage in the second direction, during the movement of the stage in said first direction moving step, so as to compensate for the deviation calculated in said calculation step.

16. A method of controlling an exposure apparatus according to claim 15, wherein the movement in the first direction performed in said first moving step is accomplished by movement in an X direction parallel to the stage traveling plane and movement in a Y direction parallel to the stage traveling plane and perpendicular to the X direction.

17. A method of controlling an exposure apparatus according to claim 16, further comprising a storage step of storing a tilt angle in the X direction between the stage traveling plane and the image plane and also storing a tilt angle in the Y direction between the stage traveling plane and the image plane, wherein in said calculation step, a sum of (i) a deviation determined from the tilt angle in the X direction and a movement distance in the X direction accomplished by the moving means and (ii) a deviation determined from the tilt angle in the Y direction and a movement distance in the Y direction is calculated and a resultant sum is determined as the deviation to be compensated for.

18. A method of controlling an exposure apparatus according to claim 15, further comprising an auto focus step in which, after the movement of the stage accomplished by the first direction and second direction moving means, a positional difference between a surface of the stage and the image plane is detected and an auto focusing process is performed in accordance with the detected positional difference.

19. A method of controlling an exposure apparatus according to claim 18, further comprising a feedback control step of providing feedback control, wherein the auto focusing process includes an auto focus adjustment based on the feedback control.

20. A method of controlling an exposure apparatus according to claim 15, wherein in said first direction moving step, the object to be exposed is moved so that a particular area of the object to be exposed comes to an area where an image is formed through the projection optical system.

21. A method of producing a device by supplying a material to an exposure apparatus including a stage movable in a first direction parallel to a stage traveling plane and also movable in a second direction substantially perpendicular to the stage traveling plane, the stage traveling plane being a plane formed by a point on the stage moving in a plurality of different first directions, the exposure apparatus being adapted to expose, via a projection optical system, an object which is to be exposed and which is placed on the stage, said method comprising:

a first direction moving step of moving the stage in the first direction by a specified distance;

a calculation step of calculating a deviation in the second direction with respect to an image plane associated with the projection optical system, the image plane being at an angle with respect to the stage traveling plane, the deviation occurring as a result of the moving of the stage in said first direction moving step, said calculation step calculating the deviation based on the specified distance and the angle; and a second direction moving step of moving the stage in the second direction, during the movement of the stage in said first direction moving step, so as to compensate for the deviation calculated in said calculation step.

* * * * *

UNITED STATES PATENT AND TRADEMARK OFFICE
CERTIFICATE OF CORRECTION

PATENT NO.   : 6,501,532 B2  
DATED        : December 31, 2002  
INVENTOR(S)  : Daisuke Suzuki It is certified that error appears in the above-identified patent and that said Letters Patent is hereby corrected as shown below:

<u>Column 2,</u>  
Line 6, "steps" should read -- step --.

<u>Column 4,</u>  
Line 34, "with specific" should read -- to specific --.

Signed and Sealed this

Fifteenth Day of July, 2003

JAMES E. ROGAN  
*Director of the United States Patent and Trademark Office*